(12) United States Patent
Iwasaki et al.

(10) Patent No.: US 11,133,456 B2
(45) Date of Patent: Sep. 28, 2021

(54) MAGNETIC STORAGE DEVICE

(71) Applicant: TOSHIBA MEMORY CORPORATION, Tokyo (JP)

(72) Inventors: Takeshi Iwasaki, Kuwana Mie (JP); Akiyuki Murayama, Tokyo (JP); Tadashi Kai, Yokohama Kanagawa (JP); Tadaomi Daibou, Yokohama Kanagawa (JP); Masaki Endo, Kawasaki Kanagawa (JP); Shumpei Omine, Tokyo (JP); Taichi Igarashi, Kawasaki Kanagawa (JP); Junichi Ito, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/351,985

(22) Filed: Mar. 13, 2019

(65) Prior Publication Data

US 2020/0083432 A1 Mar. 12, 2020

(30) Foreign Application Priority Data

Sep. 6, 2018 (JP) .............................. JP2018-167224

(51) Int. Cl.
*H01L 27/22* (2006.01)
*H01L 43/02* (2006.01)
(Continued)

(52) U.S. Cl.
CPC ............ *H01L 43/02* (2013.01); *G11C 11/161* (2013.01); *H01L 27/228* (2013.01); *H01L 43/10* (2013.01); *H01L 43/12* (2013.01)

(58) Field of Classification Search
CPC ....... H01L 43/08; H01L 43/10; H01L 27/228; H01L 43/02; H01L 43/12; H01L 27/222;
(Continued)

(56) References Cited

U.S. PATENT DOCUMENTS 9,025,362 B2   5/2015   Higo et al.
9,305,576 B2   4/2016   Noma
(Continued)

FOREIGN PATENT DOCUMENTS

JP   2012059906 A   3/2012
JP   2014060297 A   4/2014
(Continued)

*Primary Examiner* — Samuel Park
(74) *Attorney, Agent, or Firm* — Holtz, Holtz & Volek PC

(57) ABSTRACT

According to one embodiment, a magnetic storage device includes: a magnetoresistive effect element including a non-magnet, and a stacked structure on the non-magnet, the stacked structure including: a first ferromagnet on the non-magnet; an anti-ferromagnet being exchange-coupled with the first ferromagnet; and a second ferromagnet between the first ferromagnet and the anti-ferromagnet. The stacked structure is configured to: have a first resistance value in response to a first current flowing through the stacked structure in a first direction, and have a second resistance value different from the first resistance value in response to a second current flowing through the stacked structure in a second direction opposite to the first direction.

20 Claims, 14 Drawing Sheets

(51) Int. Cl.
   *H01L 43/10*   (2006.01)
   *G11C 11/16*   (2006.01)
   *H01L 43/12*   (2006.01)

(58) Field of Classification Search
   CPC . H01L 29/66984; H01L 27/224; H01L 7/226;
       H01L 43/04; H01L 43/06; H01L 29/82;
       H01L 43/065; H01L 27/105; H01L
       27/1052; H01L 7/11582; H01L 27/2481;
       H01L 28/00; H01L 45/08; H01L 45/1233;
       H01L 45/146; H01L 45/147; H01L 21/00;
       H01L 43/00; H01L 27/22; H01L 27/01;
       G11C 11/161; G11C 11/1657; G11C
              11/1675; G11C 11/15
   See application file for complete search history.

(56) References Cited

U.S. PATENT DOCUMENTS

| | | | |
|---|---|---|---|
| 2002/0006058 A1 | 1/2002 | Nakajima et al. | |
| 2004/0160810 A1* | 8/2004 | Deak | G11C 11/16 365/158 |
| 2005/0002229 A1* | 1/2005 | Matsutera | H01L 27/228 365/171 |
| 2005/0238924 A1* | 10/2005 | Gill | G11B 5/3932 428/837 |
| 2008/0316657 A1* | 12/2008 | Zhang | G01R 33/093 360/324.11 |
| 2009/0246557 A1* | 10/2009 | Horng | G11C 11/161 428/811.1 |
| 2011/0316103 A1 | 12/2011 | Uchida et al. | |
| 2012/0049843 A1* | 3/2012 | Sun | H01L 43/10 324/249 |
| 2013/0242435 A1* | 9/2013 | Fuji | G11B 5/3983 360/244 |
| 2013/0265820 A1* | 10/2013 | Chih | G11C 11/1673 365/158 |
| 2014/0077319 A1 | 3/2014 | Noma et al. | |
| 2016/0011947 A1* | 1/2016 | Hatsuda | G06F 11/1451 714/764 |
| 2016/0079516 A1* | 3/2016 | Bandiera | H01L 43/02 257/421 |
| 2016/0190435 A1* | 6/2016 | Hu | H01L 27/222 257/421 |
| 2018/0269382 A1 | 9/2018 | Omine et al. | |

FOREIGN PATENT DOCUMENTS

| | | |
|---|---|---|
| JP | 2018157033 A | 10/2018 |
| TW | 201212315 A | 3/2012 |

* cited by examiner

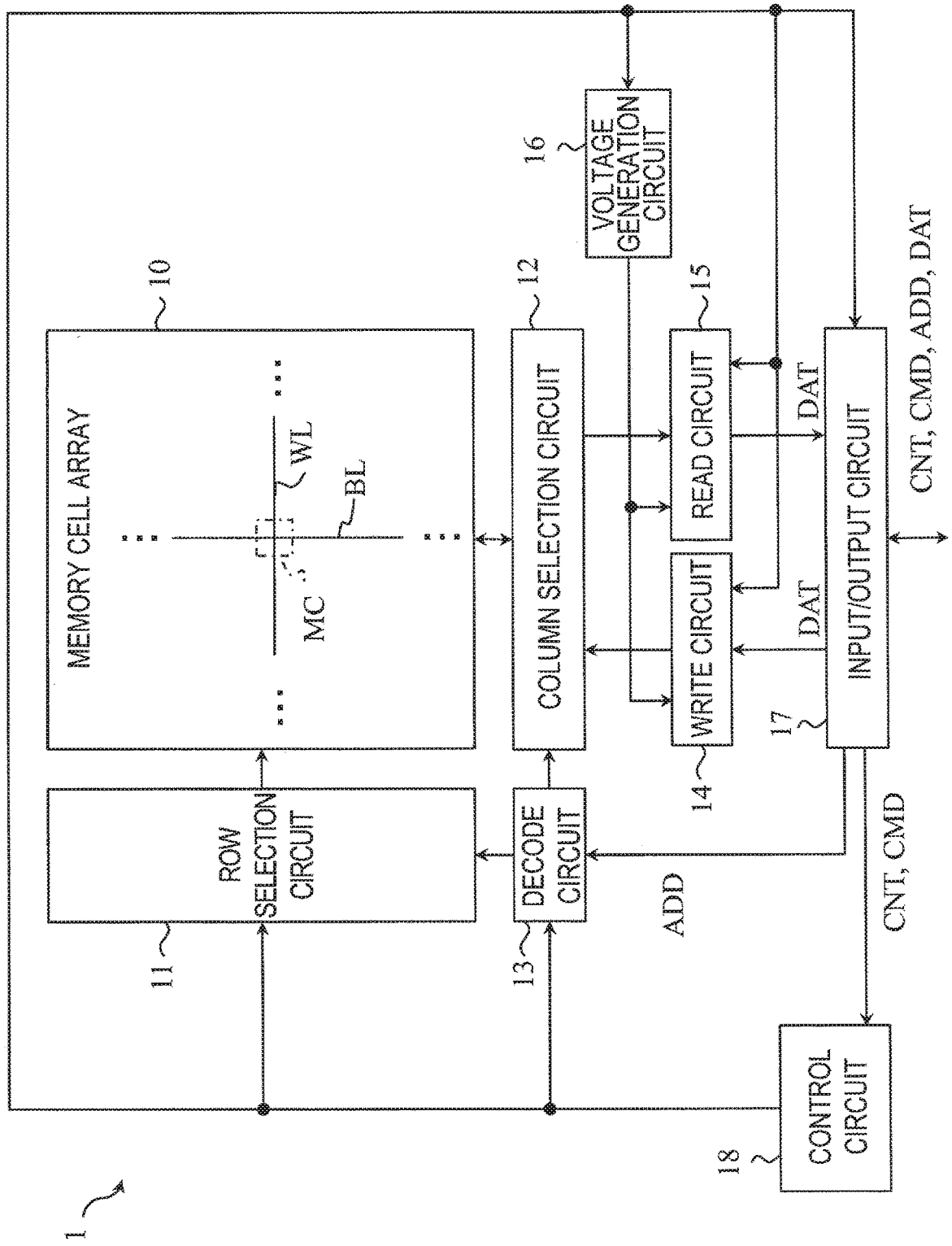
F I G. 1

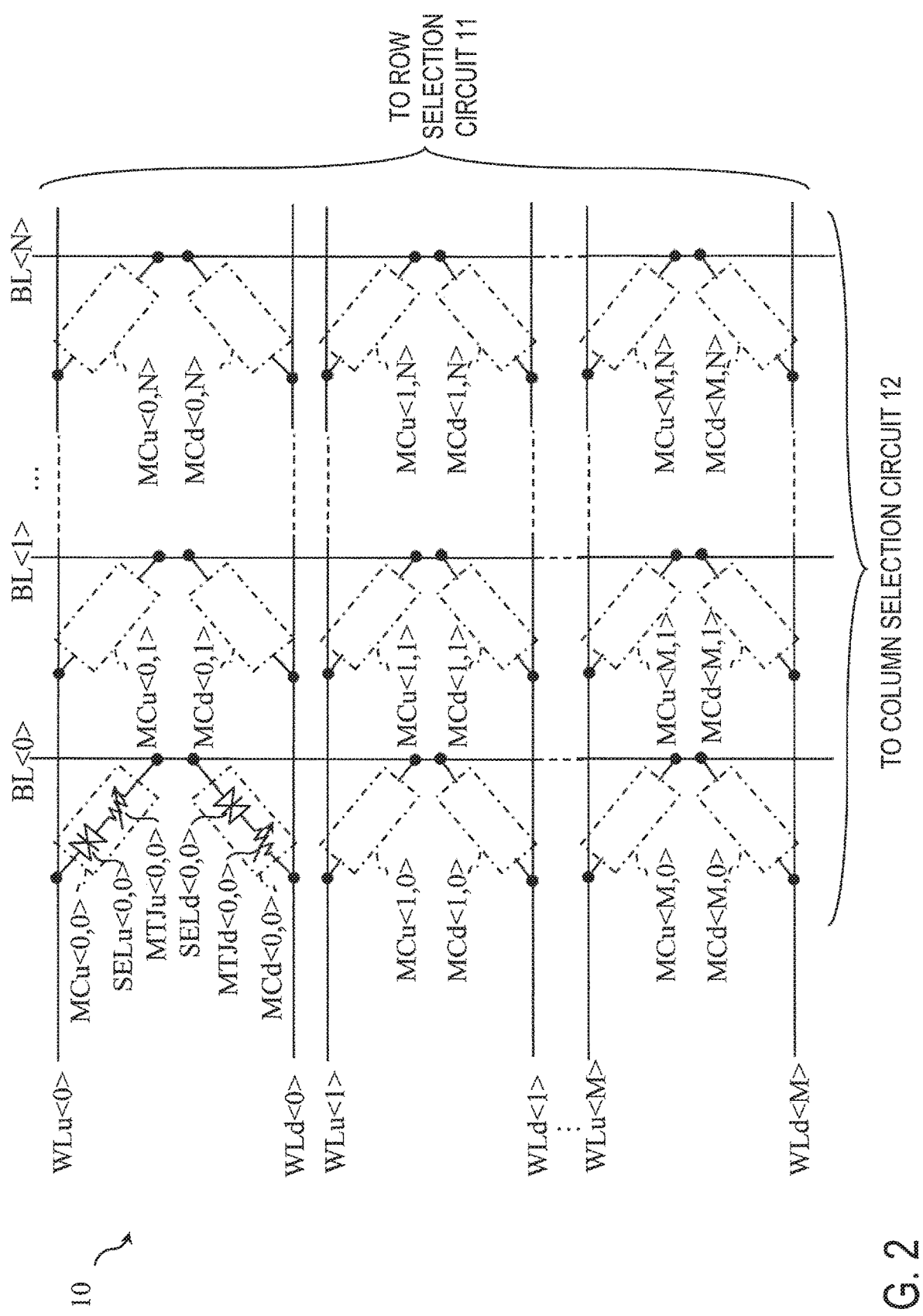
F I G. 2

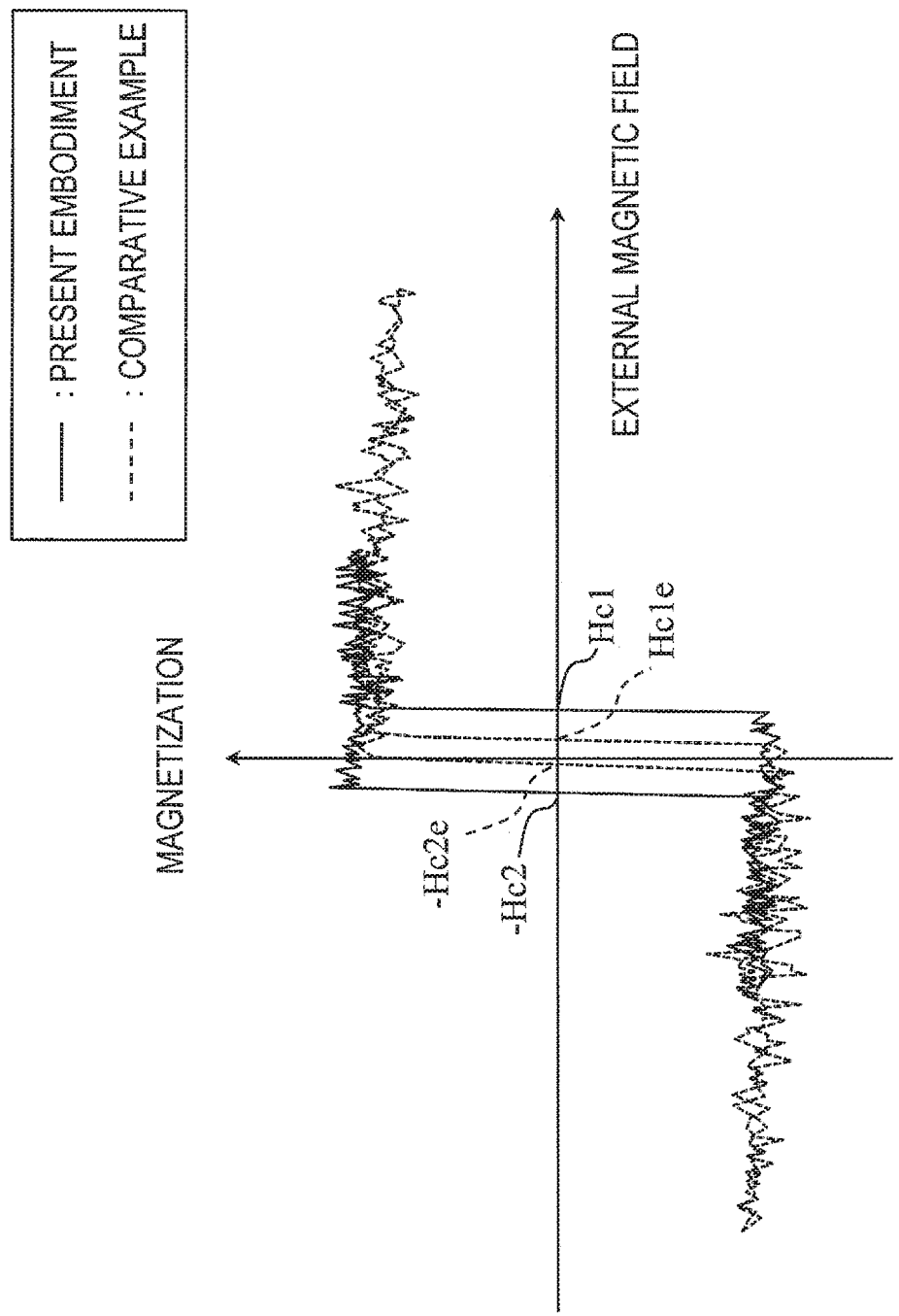
F I G. 5

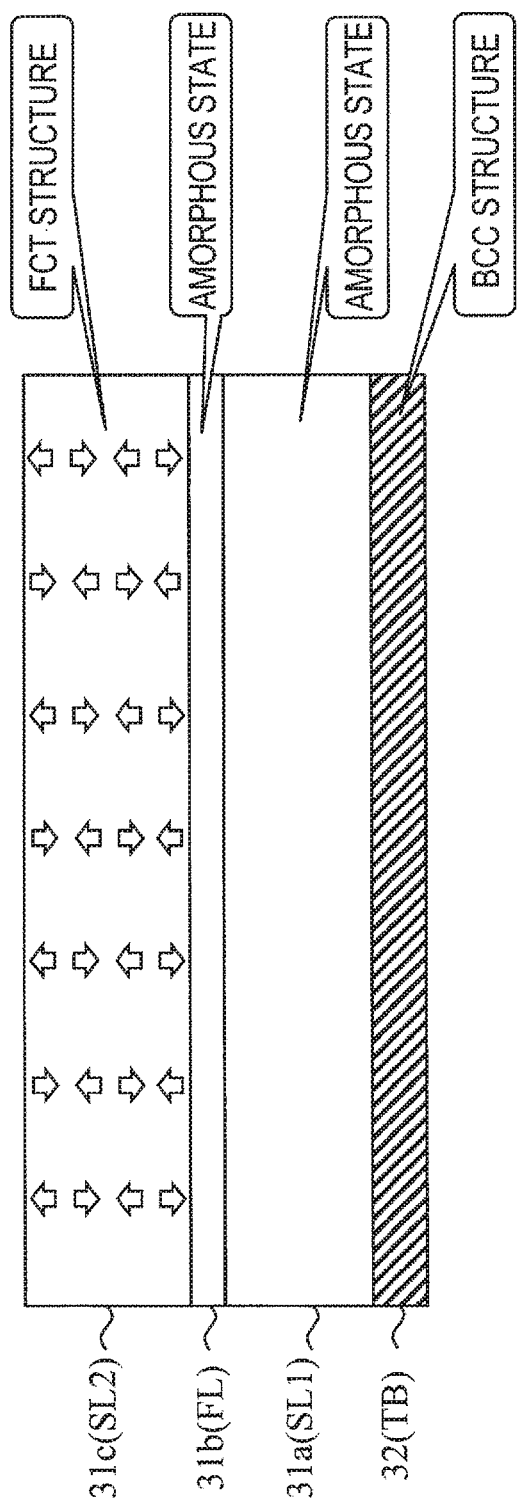
F I G. 6

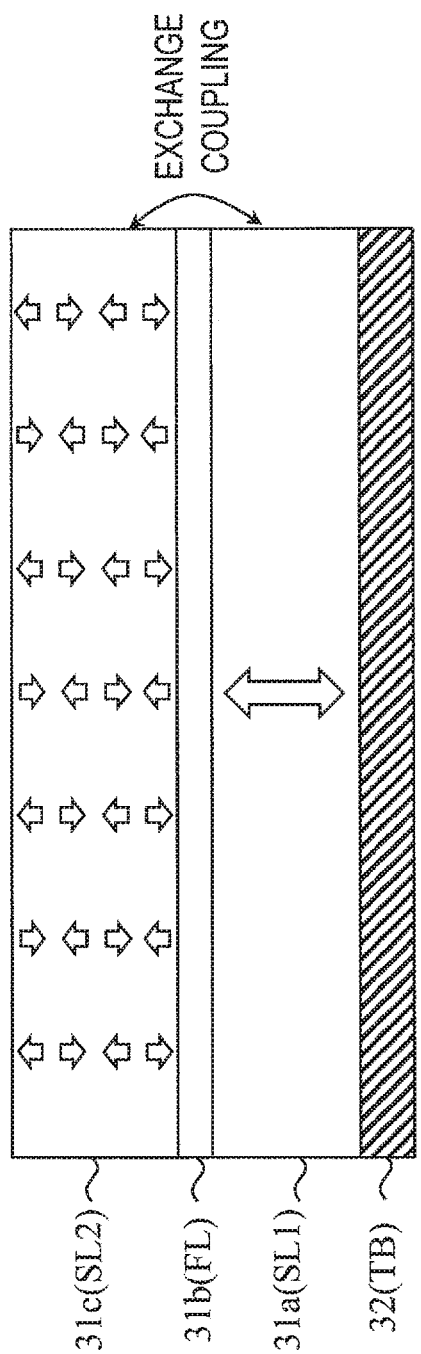
F I G. 9

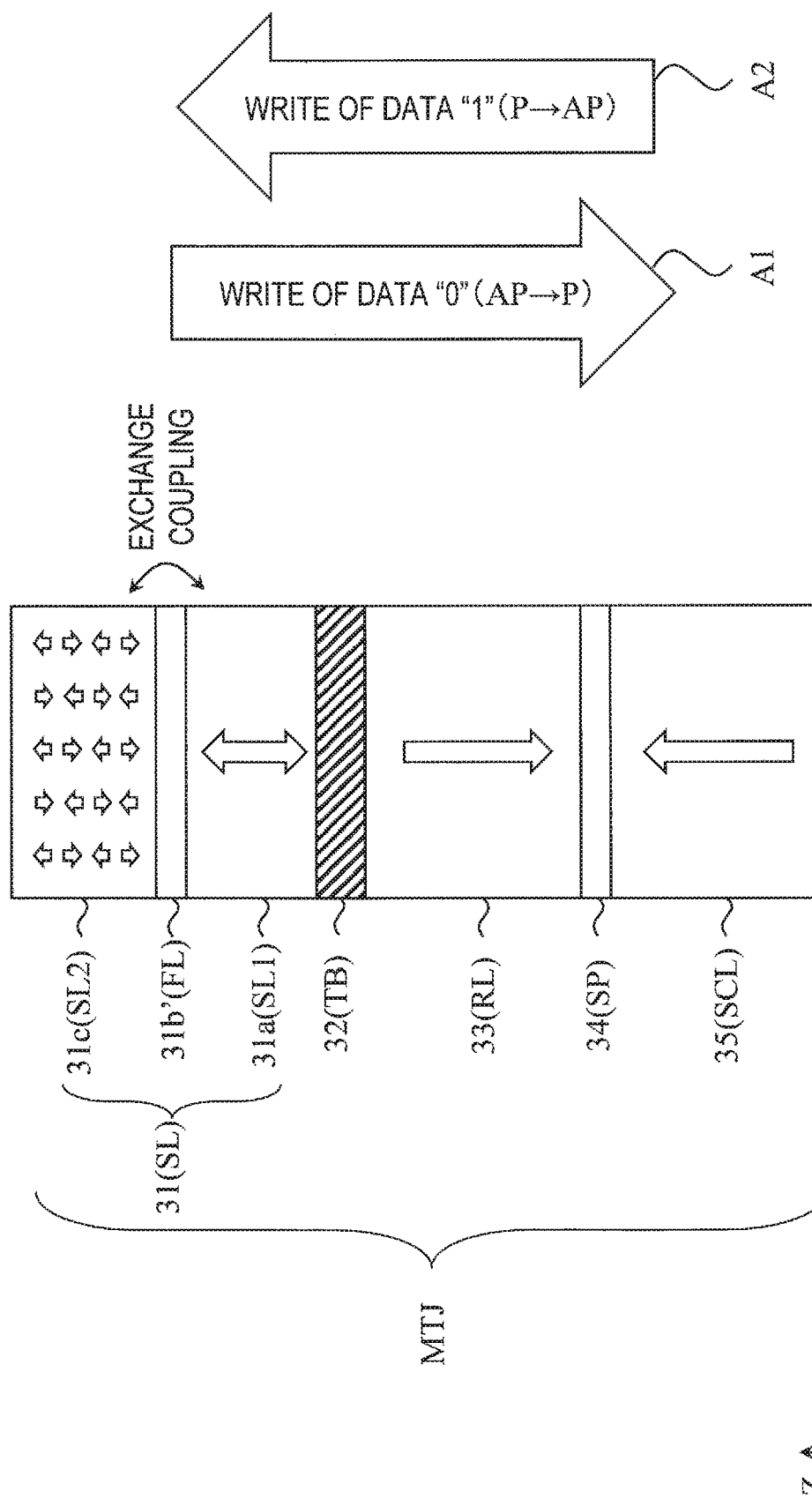
F I G. 10

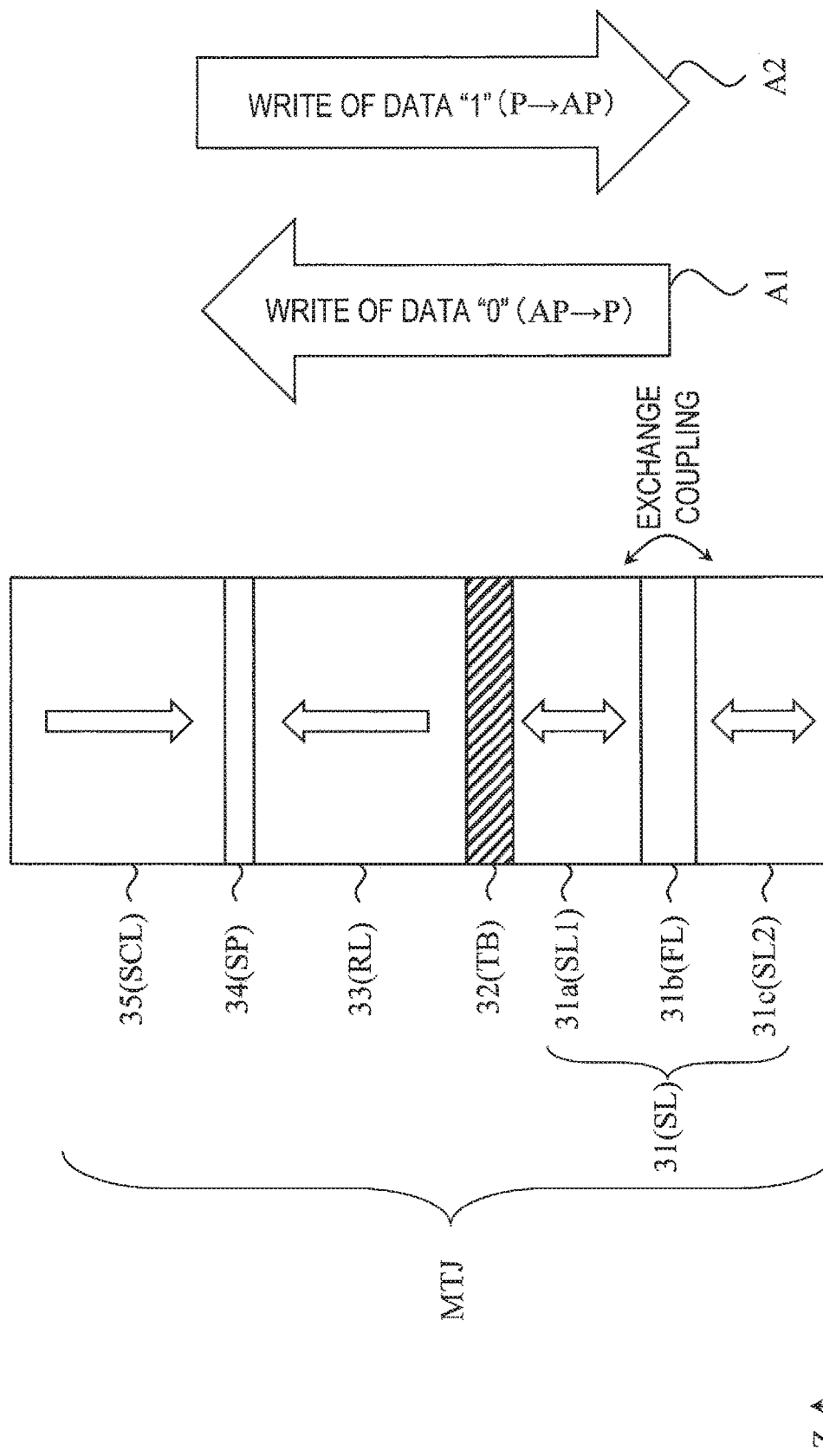
F I G. 13

MAGNETIC STORAGE DEVICE

CROSS-REFERENCE TO RELATED APPLICATIONS

This application is based upon and claims the benefit of priority from Japanese Patent Application No. 2018-167224, filed Sep. 6, 2018, the entire contents of which are incorporated herein by reference.

FIELD

Embodiments described herein relate generally to a magnetic storage device.

BACKGROUND

A magnetic storage device (MRAM: Magnetoresistive Random Access Memory) that uses a magnetoresistive effect element as a storage element is known.

BRIEF DESCRIPTION OF THE DRAWINGS

FIG. 1 is a block diagram to explain a configuration of a magnetic storage device according to a first embodiment.

FIG. 2 is a circuit diagram to explain a configuration of a memory cell array of the magnetic storage device of the first embodiment.

FIG. 5 is a diagram to explain a magnetic characteristics of a storage layer employed in the magnetoresistive effect element of the magnetic storage device of the first embodiment.

FIG. 6 is a schematic view to explain a method in which the magnetoresistive effect element of the magnetic storage device of the first embodiment is manufactured.

FIG. 9 is a schematic view to explain a method in which the magnetoresistive effect element of the magnetic storage device of the first embodiment is manufactured.

FIG. 10 is a sectional view to explain a configuration of a magnetoresistive effect element of a magnetic storage device according to a second embodiment.

FIG. 13 is a sectional view to explain a configuration of a magnetoresistive effect element of a magnetic storage device according to a first modification.

DETAILED DESCRIPTION

Figure 3:
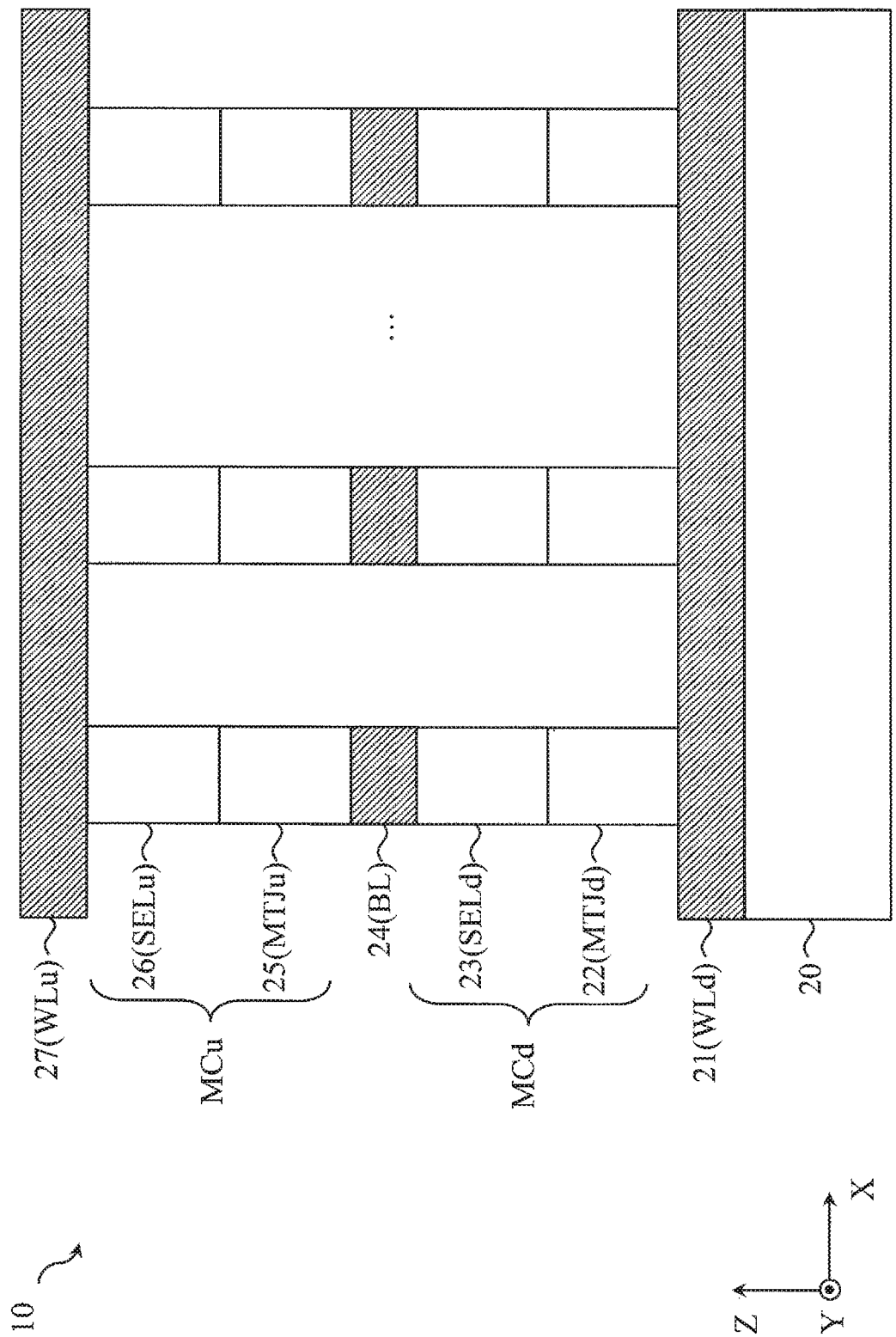
FIG. 3 is a sectional view to explain a configuration of the memory cell array of the magnetic storage device of the first embodiment.

In general, according to one embodiment, a magnetic storage device includes: a magnetoresistive effect element including a non-magnet, and a stacked structure on the non-magnet, the stacked structure including: a first ferromagnet on the non-magnet; an anti-ferromagnet being exchange-coupled with the first ferromagnet; and a second ferromagnet between the first ferromagnet and the anti-ferromagnet. The stacked structure is configured to: have a first resistance value in response to a first current flowing through the stacked structure in a first direction, and have a second resistance value different from the first resistance value in response to a second current flowing through the stacked structure in a second direction opposite to the first direction.

Embodiments will be described with reference to the accompanying drawings. In the descriptions below, structural components having similar functions and configurations will be denoted by the same reference symbols. To distinguish a plurality of structural components having common reference numerals, suffixes will be attached to the common reference numerals. If the structural components do not have to be distinguished particularly, only the common reference numerals will be used, and no suffixes will be attached. The suffixes are not limited to subscripts or superscripts, and include, for example, lower case English letters added at the end of reference numerals and indices or the like indicating arrangements.

1. First Embodiment

A magnetic storage device according to the first embodiment will be described. The magnetic storage device of the first embodiment is a magnetic storage device based on the perpendicular magnetization, which uses an element having a magnetoresistive effect by a magnetic tunnel junction (MTJ) (MTJ element or magnetoresistive effect element) as a storage element.

1.1 Configuration

First, a configuration of a magnetic storage device according to a first embodiment will be described.

1.1.1 Configuration of Magnetic Storage Device

FIG. 1 is a block diagram showing a configuration of the magnetic storage device according to the first embodiment. As shown in FIG. 1, the magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each of which is associated with a row and a column. Specifically, the memory cells MC in the same row are connected to the same word line WL, and the memory cells MC in the same column are connected to the same bit line BL.

The row selection circuit 11 is connected to the memory cell array 10 via word lines WL. A decode result (row address) of an address ADD from the decode circuit 13 is supplied to the row selection circuit 11. The row selection circuit 11 sets a word line WL corresponding to a row, based on the decode result of the address ADD, to a selected state. In the description below, a word line WL set to the selected state will be referred to as a selected word line WL. Word lines WL other than the selected word line WL will be referred to as unselected word lines WL.

The column selection circuit 12 is connected to the memory cell array 10 via bit lines BL. A decode result (column address) of an address ADD from the decode circuit 13 is supplied to the column selection circuit 12. The column selection circuit 12 sets a column based on the decode result of the address ADD to a selected state. In the description below, a bit line BL set to the selected state will be referred to as a selected bit line BL. Bit lines BL other than the selected bit line BL will be referred to as unselected bit lines BL.

The decode circuit 13 decodes an address ADD supplied from the input/output circuit 17. The decode circuit 13 supplies a decode result of the addresses ADD to both the row selection circuit 11 and the column selection circuit 12. The addresses ADD include a column address and a row address which are to be selected.

The write circuit 14 writes data to the memory cells MC. The write circuit 14 includes, for example, a write driver (not shown).

The read circuit 15 reads data from the memory cells MC. The read circuit 15 includes, for example, a sense amplifier (not shown).

The voltage generation circuit 16 generates voltages for various operations of the memory cell array 10 by using a power supply voltage provided from a device (not shown) external to the magnetic storage device 1. For example, the voltage generation circuit 16 generates various voltages necessary for a write operation, and supplies the voltages to the write circuit 14. Also, for example, the voltage generation circuit 16 generates various voltages necessary for a read operation, and supplies the voltages to the read circuit 15.

The input/output circuit 17 transfers an address ADD from the outside of the magnetic storage device 1 to the decode circuit 13. The input/output circuit 17 transfers a command CMD from the outside of the magnetic storage device 1 to the control circuit 18. The input/output circuit 17 transmits and receives various control signals CNT between the outside of the magnetic storage device 1 and the control circuit 18. The input/output circuit 17 transfers data DAT from the outside of the magnetic storage device 1 to the write circuit 14, and outputs the data DAT transferred from the read circuit 15 to the outside of the magnetic storage device 1.

Based on the control signals CNT and the command CMD, the control circuit 18 controls the operations of the row selection circuit 11, column selection circuit 12, decode circuit 13, write circuit 14, read circuit 15, voltage generation circuit 16 and output circuit 17 that are included in the magnetic storage device 1.

1.1.2 Configuration of Memory Cell Array

Next, the configuration of a memory cell array of the magnetic storage device according to the first embodiment will be described with reference to FIG. 2. FIG. 2 is a circuit diagram showing the configuration of the memory cell array of the magnetic storage device according to the first embodiment. In FIG. 2, the word lines WL are classified by subscripts including two lower case English letters ("u" and "d") and an index ("< >").

As shown in FIG. 2, memory cells MC (MCu and MCd) are arranged in a matrix in the memory cell array 10, and each memory cell MC is associated with one of a plurality of bit lines BL (BL<0>, BL<1>, . . . , BL<N>), and one of a plurality of word lines WLd (WLd<0>, WLd<1>, . . . , WLd<M>) and word lines WLu (WLu<0>, WLu<1>, . . . , WLu<M>) (M and N are arbitrary integers). That is, a memory cell MCd<i,j> ($0 \leq i \leq M$, $0 \leq j \leq N$) is connected between a word line WLd<i> and a bit line BL<j>, and a memory cell MCu<i,j> is connected between a word line WLu<i> and the bit line BL<j>.

It should be noted that suffixes "d" and "u" are, for example, for convenient identification of memory cell MC provided below bit line BL and memory cell MC provided above bit line BL, respectively. An example of a three-dimensional structure of the memory cell array 10 will be described later.

The memory cell MCd<i,j> includes a selector SELd<i,j> and a magnetoresistive effect element MTJd<i,j> which are connected in series. The memory cell MCu<i,j> includes a selector SELu<i,j> and a magnetoresistive effect elements MTJu<i,j> which are connected in series.

A selector SEL has a function as a switch to control the supply of an electric current to a corresponding magnetoresistive effect element MTJ at the time of writing data in or reading data from a corresponding magnetoresistive effect element MTJ. Specifically, if, for example, a voltage applied to a certain memory cell MC falls below a threshold voltage Vth, the selector SEL in the memory cell MC cuts off, as an insulator having a large resistance value, an electric current (is turned to the OFF-state), and if the voltage applied exceeds the threshold voltage Vth, the selector SEL in the memory cell MC feeds, as a conductor having a small resistance value, an electric current (is turned to the ON-state). That is, the selector SEL has a function capable of switching between feeding an electric current and cutting off an electric current in accordance with the magnitude of the voltage applied to the memory cell MC, regardless of the flowing direction of the electric current.

The selector SEL may be, for example, a switching element having two terminals (two terminal type) switching function. When a voltage applied between a two terminals is equal to or lower than the threshold voltage, the switching element can remain in a "high resistive" state, e.g., an electrically non-conductive state. When the voltage applied between the two terminals is higher than the threshold voltage, the switching element can turn into a "low resistive" state, e.g., the electrically conductive state. The switching element may have this function in both polarity of the voltage. For example, the switching element may include at least one chalcogen element selected from the group consisting of tellurium (Te), selenium (Se) and sulfur (S). Alternatively, it may include, for example, a chalcogenide which is a compound including the chalcogen element. Also, the switching element may include, for example, at least one selected from the group including boron (B), aluminum (Al), gallium (Ga), indium(In), carbon (C), silicon (Si), germanium (Ge), tin (Sn), arsenic (As), phosphorus (P), and antimony (Sb).

Magnetoresistive effect element MTJ can have its resistance value switchable between the low resistance state and the high resistance state in accordance with the current supply controlled by selector SEL. Magnetoresistive effect element MTJ can write data in accordance with the change in the resistance state, and functions as a storage element which can hold the written data in a nonvolatile manner and cause the data to be read out.

Next, the cross-sectional structure of the memory cell array 10 will be described with reference to FIG. 3. FIG. 3 shows an example of a cross-sectional structure of the memory cell array taken along the word line in the magnetic storage device according to the first embodiment.

As shown in FIG. 3, the magnetic storage device 1 is disposed above a semiconductor substrate 20. In the description below, a plane parallel to the surface of the semiconductor substrate 20 is defined as an XY plane, and the direction perpendicular to the XY plane is defined as a Z direction. The direction along the word lines WL is defined as an X direction, and the direction along bit lines BL is defined as a Y direction.

On the upper surface of the semiconductor substrate 20, for example, a plurality of conductors 21 functioning as word lines WLd are disposed. The conductors 21 are disposed and arranged side by side, for example, in the Y direction, and each of the conductors 21 extends in the X direction. In FIG. 3, only one of the conductors 21 is shown. On the upper surface of one conductor 21, a plurality of elements 22 functioning as magnetoresistive effect elements MTJd are disposed and arranged side by side, for example, in the X direction. That is, a plurality of elements 22 arranged side by side in the X direction are commonly connected to the one conductor 21. On each of the upper surfaces of the elements 22, element 23 functioning as a selector SELd is disposed. Conductors 24 functioning as bit lines BL are disposed on the upper surfaces of respective elements 23. Conductors 24 are disposed side by side, for example, in the X direction, and each of conductors 21 extends in the Y direction. That is, a plurality of elements 23 arranged side by side in the Y direction are commonly connected to one of conductors 24.

On each of the upper surfaces of the conductors 24, a plurality of elements 25 functioning as magnetoresistive effect elements MTJu are disposed. That is, the plurality of elements 25 arranged side by side in the Y direction are commonly connected to one of conductors 24. Elements 25 have, for example, the same functional configuration as elements 22. On each of the upper surfaces of the elements 25, elements 26 functioning as selectors SELd are disposed. Elements 26 have, for example, the same functional configuration as elements 23. One conductor 27 functioning as word line WLu is commonly connected to the upper surfaces of respective elements 26 arranged in the X direction. A plurality of such conductors 27 are provided side by side in the Y direction. Each of conductors 27 extends, for example, in the X direction.

With the above configuration, the memory cell array 10 has a structure in which two word lines WLd and WLu correspond to one bit line BL. The memory cell array 10 has a structure in which memory cell MCd is disposed between word line WLd and bit line BL and memory cell MCu is disposed between bit line BL and word line WLu so that multiple layers functioning as memory cell array 10 are disposed in Z direction. In the structure in which multiple layers functioning as memory cell array 10 are disposed in Z direction as shown in FIG. 3, memory cell MCd is associated with the lower layer and memory cell MCu is associated with the upper layer. That is, of the two memory cells MC commonly connected to one bit line BL, the memory cell MC disposed above the bit line BL corresponds to memory cell MCu with the suffix "u", and the memory cell MC disposed below the bit line BL corresponds to memory cell MCd with the suffix "d".

In the example shown in FIG. 3, conductor 21, elements 22 and 23, conductors 24, elements 25 and 26 and conductor 27 are shown as being in contact with each other, but this configuration is not restrictive. Other elements may be interposed between the elements.

1.1.3 Configuration of Magnetoresistive Effect Element

Figure 4:
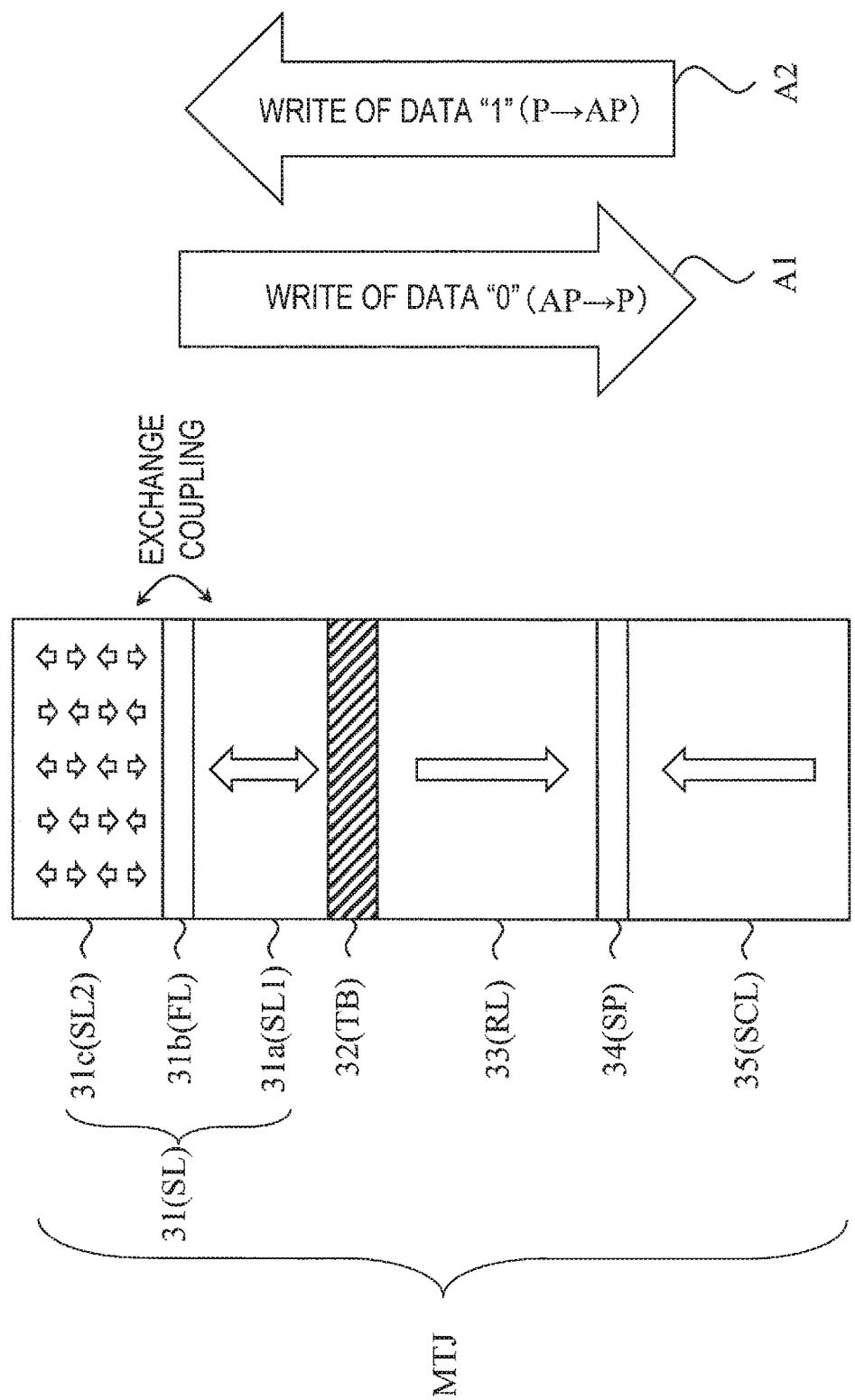
FIG. 4 is a sectional view to explain a configuration of a magnetoresistive effect element of the magnetic storage device of the first embodiment.

Next, the configuration of the magnetoresistive effect element of the magnetic storage device according to the first embodiment will be described with reference to FIG. 4. FIG. 4 is a sectional view showing the configuration of the magnetoresistive effect element of the magnetic storage device according to the first embodiment. FIG. 4 shows an example of a cross section taken along a plane (for example, the XZ plane) perpendicular to the Z direction of magnetoresistive effect element MTJ shown in FIG. 3 (that is, element 22 or 25).

As shown in FIG. 4, each of elements 22 and 25 includes a stacked structure 31 functioning as a storage layer SL, an non-magnetic layer 32 functioning as a tunnel barrier layer TB, a ferromagnetic layer 33 functioning as a reference layer RL, an non-magnetic layer 34 functioning as a spacer layer SP, and a ferromagnetic layer 35 functioning as a shift cancelling layer SCL.

For example, the element 22 includes the ferromagnetic layer 35, the non-magnetic layer 34, the ferromagnetic layer 33, the non-magnetic layer 32, and the stacked structure 31, which are stacked in this order in the direction from the word line WLd side toward the bit line BL side (i.e., in the Z direction). For example, the element 25 includes the ferromagnetic layer 35, the non-magnetic layer 34, the ferromagnetic layer 33, the non-magnetic layer 32, and the stacked structure 31, which are stacked in this order in the direction from the bit line BL side toward the word line WLu side (i.e., in the Z direction). For example, the elements 22 and 25 function as MTJ elements of the perpendicular magnetization type in which the magnetization directions of the magnetic materials constituting the elements 22 and 25 are perpendicular to the film surfaces.

The stacked structure 31 includes a ferromagnetic layer 31a functioning as an interface storage layer SL1, a soft magnetic layer 31b functioning as a function layer FL, and an anti-ferromagnet 31c functioning as layer SL2 exchange-coupled with the interface storage layer SL1. The stacked structure 31 is formed such that the ferromagnetic layer 31a, the soft magnetic layer 31b and the anti-ferromagnet 31c are laminated on the non-magnetic layer 32 in the order mentioned.

The ferromagnetic layer 31a has ferromagnetic property and has an easy magnetization axis in the direction perpendicular to the film surface. The ferromagnetic layer 31a has a magnetization direction oriented toward the bit line BL side or the word line WL side. The ferromagnetic layer 31a contains, for example, cobalt iron boron (CoFeB) or iron boride (FeB), and may have a body-centered cubic (bcc) crystal structure.

The soft magnetic layer 31b has soft magnetic property and has a magnetization direction oriented in the same direction as the ferromagnetic layer 31a by magnetically coupling with the ferromagnetic layer 31a. To provide soft magnetic property, the soft magnetic layer 31b contains at least one kind of element selected from cobalt (Co), iron (Fe), nickel (Ni), and manganese (Mn). To easily attain an amorphous state, the soft magnetic layer 31b may contain at least one kind of element selected from cobalt (Co), iron (Fe), nickel (Ni) and manganese (Mn), and at least one kind of element selected from niobium (Nb), zirconium (Zr), tantalum (Ta), titanium (Ti), hafnium (Hf), silicon (Si) and gadolinium (Gd). More specifically, the soft magnetic layer 31b may contain at least one kind of alloy selected from, for example, cobalt titanium (CoTi), cobalt hafnium (CoHf), cobalt zirconium (CoZr), nickel niobium (NiNb), nickel zirconium (NiZr), nickel tantalum (NiTa), nickel titanium (NiTi), nickel hafnium (NiHf), manganese silicon (MnSi) and manganese gadolinium (MnGd). In addition, the soft magnetic layer 31b may contain boron (B) as impurities. The soft magnetic layer 31b has, for example, an amorphous structure and has a function of joining the ferromagnetic layer 31a and anti-ferromagnet 31c of different crystal structures while crystallographically dividing them. The soft magnetic layer 31b has a function of maintaining exchange coupling between the ferromagnetic layer 31a and the anti-ferromagnet 31c, for example, by its own magnetism. In order to maintain this exchange coupling, the soft magnetic layer 31b is preferably a thin film and has a film thickness of, for example, 0.1 nanometers or more and 0.3 nanometers or less.

The anti-ferromagnet 31c has anti-ferromagnetic property and is exchange-coupled with the ferromagnetic layer 31a, with the soft magnetic layer 31b interposed. As described above, the anti-ferromagnet 31c has no magnetization when used solely, but has a function of increasing the magnetization volume of the stacked structure 31 owing to the exchange coupling with the ferromagnetic layer 31a. Therefore, the magnetization direction of the ferromagnetic layer 31a is less influenced by external disturbances, such as heat, an external magnetic field and the like, in the state in which the anti-ferromagnet 31c is exchange-coupled with the ferromagnetic layer 31a than in the state where it is not exchange-coupled with the ferromagnetic layer 31a.

It is desirable that the anti-ferromagnet 31c does not lose anti-ferromagnetism even when it is exposed to high temperature environment (e.g., 300° C. to 400° C.). That is, the anti-ferromagnet 31c is desirably made of, for example, a material having a Neel temperature of 600K or more. Preferably, the anti-ferromagnet 31c is made of a material which does not disturb the direction of the spin torque injected into the ferromagnetic layer 31a at the time of writing. Thus, the anti-ferromagnet 31c is preferably made of a material having a small Gilbert damping constant, namely, a material having a relatively small atomic number in the periodic table, more specifically, a material having a smaller amoic number than a 5d transition metal such as Platinum (Pt) and Iridium (Ir). As a material that satisfies this requirement, the anti-ferromagnet 31c may include nickel manganese (NiMn) or palladium manganese (PdMn). In this case, the anti-ferromagnet 31c may have a face centered tetragonal (fct) crystal structure, which is different from the crystal structure of the ferromagnetic layer 31a.

The non-magnetic layer 32 is a non-magnetic insulating film and contains, for example, magnesium oxide (MgO). The non-magnetic layer 32 is disposed between ferromagnetic layer 31a and ferromagnetic layer 33, and provides a magnetic tunnel junction between these two ferromagnetic bodies.

Ferromagnetic layer 33 has ferromagnetic property and has an easy magnetization axis in the direction perpendicular to the film surface. Ferromagnetic layer 33 has a magnetization direction oriented toward the bit line BL side or the word line WL side. Ferromagnetic layer 33 includes, for example, cobalt iron boron (CoFeB) or iron boride (FeB). The magnetization direction of ferromagnetic layer 33 is fixed, and in the example shown in FIG. 4, it is orientated toward ferromagnetic layer 35. The phrase "the magnetization direction is fixed" means that the magnetization direction does not change due to a current (spin torque) having a magnitude that may reverse the magnetization direction of ferromagnetic layer 31a exchange-coupled with the anti-ferromagnet 31c.

Although not shown in FIG. 4, the ferromagnetic layer 33 may be a stacked structure including a plurality of layers. Specifically, for example, the stacked structure constituting ferromagnetic layer 33 may have a structure in which a further ferromagnetic layer is formed, with a non-magnetic conductor interposed, on a layer containing cobalt iron boron (CoFeB) or iron boride (FeB) such that the further ferromagnetic layer is located above the surface facing ferromagnetic layer 35. The non-magnetic conductor in the stacked structure constituting ferromagnetic layer 33 may contain at least one kind of metal selected from, for example, tantalum (Ta), hafnium (Hf), tungsten (W), zirconium (Zr), molybdenum (Mo), niobium (Nb) and titanium (Ti). The further ferromagnetic layer in the stacked structure constituting ferromagnetic layer 33 may include at least one artificial lattice selected from, for example, a multilayer film of cobalt (Co) and platinum (Pt) (namely, a Co/Pt multilayer film), a multilayer film of cobalt (Co) and nickel (Ni) (namely, a Co/Ni multilayer film), and a multilayer film of cobalt (Co) and palladium (Pd) (namely, a Co/Pd multilayer film).

The non-magnetic layer 34 is a non-magnetic conductive film and contains at least one kind of element selected from, for example, ruthenium (Ru), osmium (Os), iridium (Ir), vanadium (V), and chromium (Cr).

Ferromagnetic layer 35 has ferromagnetic property and has an easy magnetization axis in the direction perpendicular to the film surface. Ferromagnetic layer 35 contains at least one kind of alloy selected from, for example, cobalt platinum (CoPt), cobalt nickel (CoNi), and cobalt palladium (CoPd). Like ferromagnetic layer 33, ferromagnetic layer 35 may be a stacked structure including a plurality of layers. In this case, ferromagnetic layer 35 may include at least one artificial lattice selected from, for example, a multilayer film of cobalt (Co) and platinum (Pt) (namely, a Co/Pt multilayer film), a multilayer film of cobalt (Co) and nickel (Ni) (namely, a Co/Ni multilayer film), and a multilayer film of cobalt (Co) and palladium (Pd) (namely, a Co/Pd multilayer film).

Ferromagnetic layer 35 has a magnetization direction oriented toward the bit line BL side or the word line WL side. The magnetization direction of ferromagnetic layer 35 is fixed, and in the example shown in FIG. 4, it is orientated toward ferromagnetic layer 33. The phrase "the magnetization direction is fixed" means that the magnetization direction does not change due to a current (spin torque) having a magnitude that may reverse the magnetization direction of ferromagnetic layer 31a exchange-coupled with the anti-ferromagnet 31c.

Ferromagnetic bodies 33 and 35 are anti-ferromagnetically coupled with each other by the non-magnetic layer 34. That is, ferromagnetic bodies 33 and 35 are coupled such that they have antiparallel magnetization directions. For this reason, in the example shown in FIG. 4, the magnetization direction of ferromagnetic layer 33 is orientated toward ferromagnetic layer 35. This coupling structure among the ferromagnetic layer 33, the non-magnetic layer 34, and the ferromagnetic layer 35 is called a SAF (Synthetic Anti- Ferromagnetic) structure. With this structure, ferromagnetic layer 35 can cancel out the influence which a stray field of ferromagnetic layer 33 may have on the magnetization direction of ferromagnetic layer 31a. For this reason, the ferromagnetic layer 31a is prevented from becoming asymmetric in the ease of magnetization reversal (that is, the ease with which the magnetization direction reverses differs depending upon the directions) due to an external factor caused by the stray field of ferromagnetic layer 33 or the like.

The first embodiment adopts the spin injection write method, in which a write current is supplied directly to a magnetoresistive effect element MTJ, spin torque is injected into a storage layer SL and a reference layer RL by that write current, and the magnetization direction of the storage layer SL and the magnetization direction of the reference layer RL are controlled. The magnetoresistive effect element MTJ can take either the low resistive state or the high resistive state, depending on whether the relative relationship between the magnetization direction of the storage layer SL and the magnetization direction of the reference layer RL is parallel or antiparallel.

When a write current Iw0 having a certain magnitude is supplied to the magnetoresistive effect element MTJ in the direction of arrow A1 shown in FIG. 4, that is, in the direction from the storage layer SL to the reference layer RL, the relative relationship between the magnetization direction of the storage layer SL and the magnetization direction of the reference layer RL is parallel. In this parallel state, the resistance value of the magnetoresistive effect element MTJ is lowest, and the magnetoresistive effect element MTJ is in the low resistive state. This low resistive state is called a "P (parallel) state", and is defined, for example, as a state of data "0".

When a write current Iw1 having a magnitude larger than that of write current Iw0 is supplied to the magnetoresistive effect element MTJ in the direction of arrow A2 shown in FIG. 4, that is, in the direction from the reference layer RL to the storage layer SL (i.e., in the opposite direction as arrow A1), the relative relationship between the magnetization direction of the storage layer SL and the magnetization direction of the reference layer RL is antiparallel. In this antiparallel state, the resistance value of the magnetoresistive effect element MTJ is highest, and the magnetoresistive effect element MTJ is in the high resistance state. This high resistance state is called a "AP (Anti-Parallel) state", and is defined, for example, as a state of data "1".

In the description set forth below, reference will be made to the case where data is specified as above, but the way of specifying data "1" and data "0" is not limited to the above example. For example, the P state may be defined as data "1", and the AP state may be defined as data "0".

FIG. 5 is a diagram to explain a magnetic characteristics of the storage layer employed in the magnetoresistive effect element of the magnetic storage device according to the first embodiment. FIG. 5 shows the hysteresis of the magnetization of storage layer SL according to the first embodiment and the comparative example. Specifically, the hysteresis of the storage layer SL according to the first embodiment is indicated by solid lines, while the hysteresis of the storage layer SL of the comparative example is indicated by broken lines. The storage layer SL of the comparative example shown in FIG. 5 does not include the anti-ferromagnet 31c, and has a configuration obtained, for example, by removing the soft magnetic layer 31b and the anti-ferromagnet 31c from the stacked structure 31 shown in FIG. 4.

As shown in FIG. 5, when a positive external magnetic field is kept applied, the direction of magnetization of the storage layer SL of the comparative example reverses in response to magnetic field Hc1e, whereas the direction of magnetization of the storage layer SL according to the first embodiment reverses in response to magnetic field Hc1 (>Hc1e) stronger than Hc1e. Likewise, when a negative external magnetic field is kept applied, the direction of magnetization of the storage layer SL of the comparative example reverses in response to magnetic field −Hc2e, whereas the direction of magnetization of the storage layer SL according to the first embodiment reverses in response to magnetic field −Hc2 (<−Hc2e) whose absolute value is larger than that of magnetic field −Hc2e. As can be seen from this, in the storage layer SL according to the first embodiment, the anti-ferromagnet 31c is exchange-coupled with the ferromagnetic layer 31a, so that the direction of magnetization of the ferromagnetic layer 31a hardly reverses in response to an external magnetic field (that is, the coercive force increases and the retention is improved).

In addition, the maximum value (or minimum value) of magnetization which the storage layer SL according to the first embodiment takes after the direction of magnetization reverses is similar to that which the storage layer SL of the comparative example takes. Therefore, it can be confirmed that the magnetization of the stacked structure 31 as a whole is not significantly increased by the soft magnetic layer 31b and the anti-ferromagnet 31c.

1.2 Manufacturing Method

Next, a method of manufacturing a magnetoresistive effect element of the magnetic storage device according to the first embodiment will be described.

FIGS. 6 to 9 are schematic views to explain a method of manufacturing the magnetoresistive effect element of the magnetic storage device of the first embodiment. For the sake of convenience of description, the ferromagnetic layer 31a, the soft magnetic layer 31b, the anti-ferromagnet 31c, and the non-magnetic layer 32 are illustrated as layers constituting the magnetoresistive effect element MTJ, and illustration of the other layers is omitted.

Figure 7:
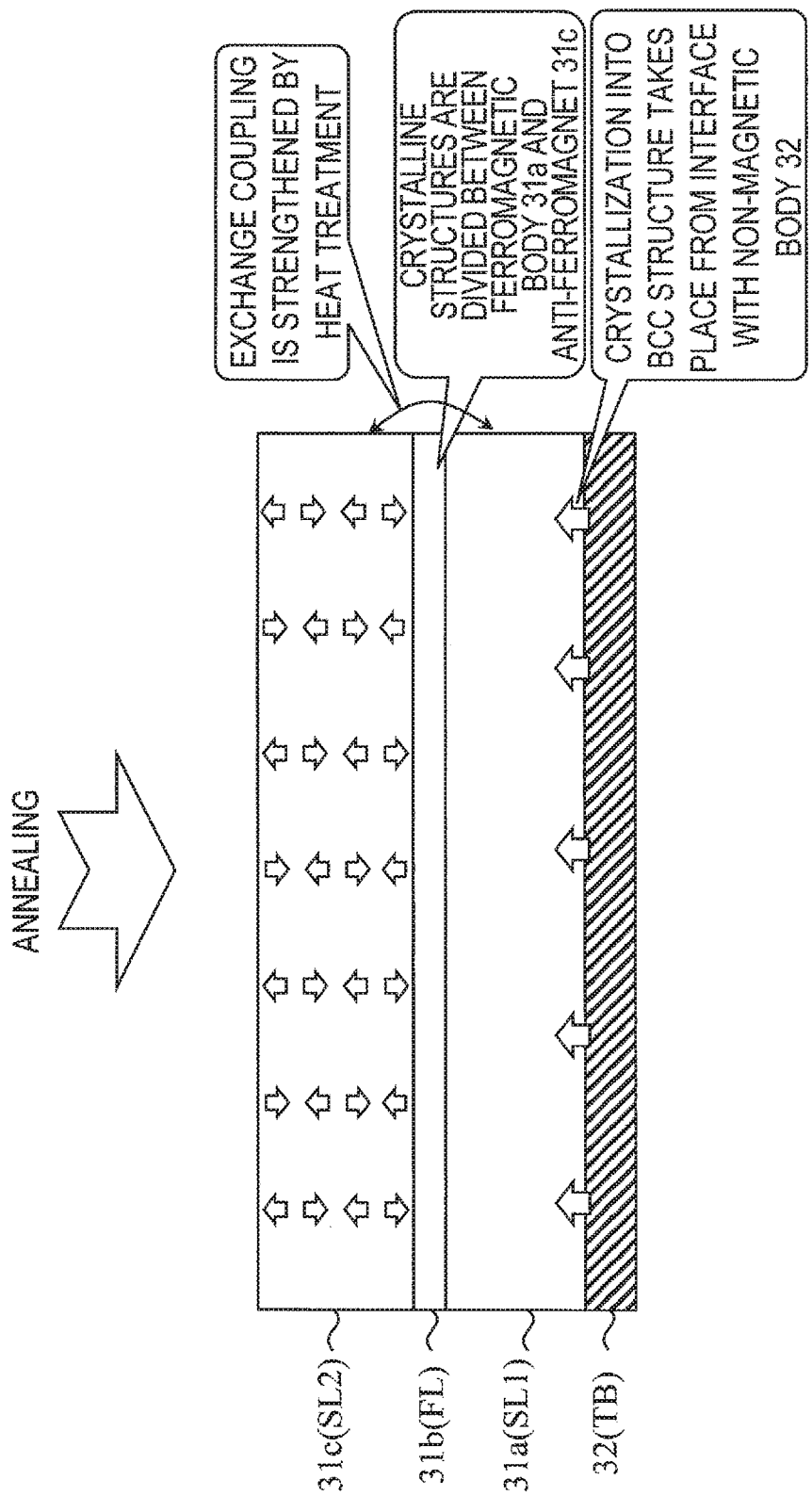
FIG. 7 is a schematic view to explain a method in which the magnetoresistive effect element of the magnetic storage device of the first embodiment is manufactured.
Figure 8:
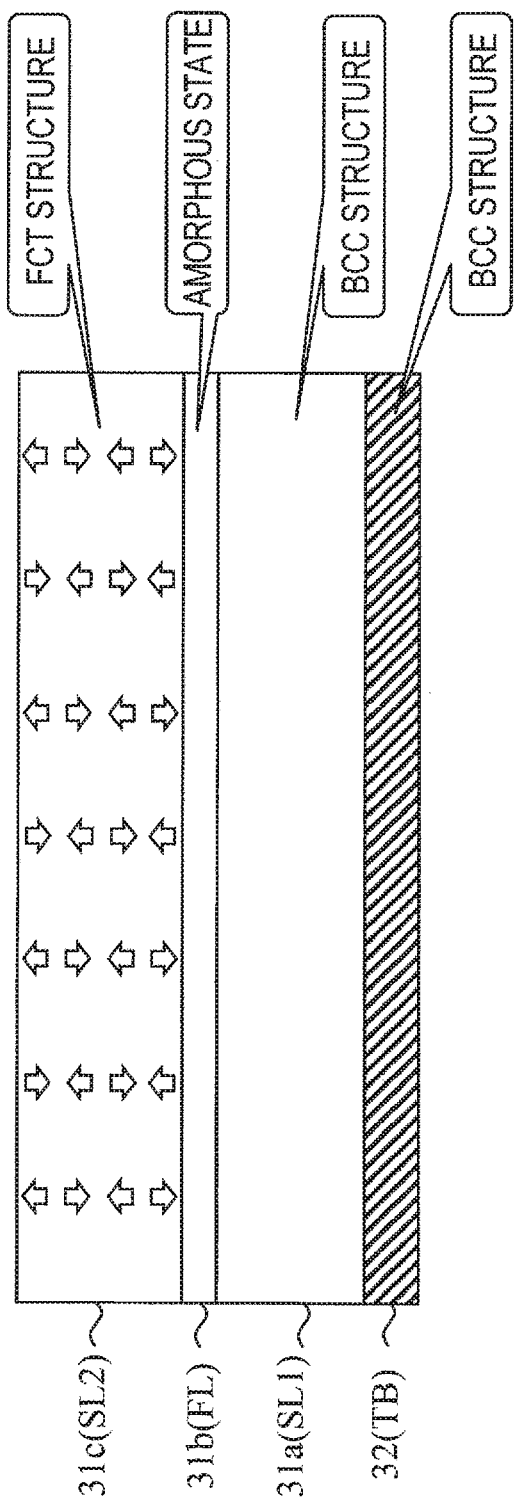
FIG. 8 is a schematic view to explain a method in which the magnetoresistive effect element of the magnetic storage device of the first embodiment is manufactured.

FIG. 6 shows a state where various materials which are to function as the tunnel barrier layer TB and the storage layer SL are stacked, and an annealing process is to be performed. FIG. 7 shows a state where the annealing process is being executed after the state shown in FIG. 6. FIG. 8 shows a state where the annealing process has been finished after the state shown in FIG. 7. FIG. 9 shows a state in which the function of the storage layer SL is provided by performing magnetization process after the state shown in FIG. 8. The states shown in FIGS. 6 to 9 will be described in order.

As shown in FIG. 6, a non-magnetic layer 32, a ferromagnetic layer 31a, a soft magnetic layer 31b, and an anti-ferromagnet 31c are stacked in this order. The non-magnetic layer 32 is stacked such that it has a bcc crystal structure. The ferromagnetic layer 31a and the soft magnetic layer 31b are stacked such that they are in an amorphous state, and the anti-ferromagnet 31c is stacked such that it has an fct crystal structure. Each of the stacked layers is removed, for example, by etching using an ion beam, except for those portions which are to function as the magnetoresistive effect element MTJ.

Next, as shown in FIG. 7, an annealing process is performed for the stacked layers shown in FIG. 6. Specifically, heat (in the range of 300° C. to 400° C., for example) is externally applied to the stacked layers for a predetermined period, whereby the ferromagnetic layer 31a is converted from the amorphous state into a crystalline state. The non-magnetic layer 32 can control the orientation of the crystal structure of the ferromagnetic layer 31a. In other words, the ferromagnetic layer 31a can grow (solid phase epitaxy) a crystal structure with the non-magnetic layer 32 as a seed. As a result, a lattice spacing in the crystal plane the ferromagnetic layer 31a equals to a lattice spacing in the crystal plane of the non-magnetic layer 32, and therefore the ferromagnetic layer 31a has a bcc crystal structure. Here, such a relationship between the ferromagnetic layer 31a and the non-magnetic layer 32 is referred to as the "same structure".

During the annealing process as described above, the soft magnetic layer 31b in the amorphous state prevents the ferromagnetic layer 31a from crystallizing from the side of the anti-ferromagnet 31c. As a result, the soft magnetic layer 31b can crystallographically divide the ferromagnetic layer 31a of the bcc crystal structure and the anti-ferromagnet 31c of the fct crystal structure from each other. Along with the crystallization of the ferromagnetic layer 31a, boron (B) contained in the ferromagnetic layer 31a diffuses into the surrounding layers (for example, the soft magnetic layer 31b). Since boron (B) is injected, the soft magnetic layer 31b can easily maintain the amorphous state.

In addition, the soft magnetic layer 31b maintains exchange coupling between the ferromagnetic layer 31a and the anti-ferromagnet 31c by its own magnetism. The exchange coupling becomes stronger in a higher temperature environment. Since, as described above, the anti-ferromagnet 31c is designed such that the Neel temperature is higher than the temperature at the time of annealing process, the anti-ferromagnet 31c is not deprived of anti-ferromagnetism by annealing process, and exchange coupling with the ferromagnetic layer 31a can be strengthened.

Next, as shown in FIG. 8, the annealing process shown in FIG. 7 finishes. As described above, the soft magnetic layer 31b prevents the anti-ferromagnet 31c of the fct crystal structure from having adverse effects on the crystallization of the ferromagnetic layer 31a into the bcc structure. Thus, the ferromagnetic layer 31a is allowed to have characteristics required for functioning as a storage layer SL, such as interfacial magnetic anisotropy.

Next, as shown in FIG. 9, a magnetization process is performed for each of the layers that are subjected to the annealing process shown in FIG. 8. Specifically, a magnetic field sufficiently intense to magnetize the ferromagnetic layer 31a exchange-coupled with the anti-ferromagnet 31c is applied to each of the layers in a predetermined direction, thereby magnetizing the ferromagnetic layer 31a. Along with this, the soft magnetic layer 31b is magnetized in the same magnetization direction as the ferromagnetic layer 31a. As a result, the ferromagnetic layer 31a, the soft magnetic layer 31b, and the anti-ferromagnet 31c are allowed to function as a storage layer SL.

In this manner, the process of manufacturing the magnetoresistive effect element MTJ finishes.

1.3 Advantages of Present Embodiment

According to the first embodiment, the storage layer SL is made of the stacked structure 31 including the ferromagnetic layer 31a and the anti-ferromagnet 31c. Owing to this, the ferromagnetic layer 31a is exchange-coupled with the anti-ferromagnet 31c, and the magnetization volume of the stacked structure 31 can be increased as a whole without increasing the magnetization of the stacked structure 31. Therefore, the magnetization direction of the ferromagnetic layer 31a of the stacked structure 31 is hard to reverse, despite external disturbances such as heat or an external magnetic field, and the retention is thus improved. In addition, since the magnetization of the stacked structure 31 does not increase as a whole, the addition of the anti-ferromagnet 31c does not necessitate redesigning the reference layer RL and the shift cancel layer SCL, and an increase in the load at the time of design can be suppressed.

The anti-ferromagnet 31c contains at least one kind of alloy selected from nickel manganese (NiMn) and palladium manganese (PdMn). Owing to this, the anti-ferromagnet 31c can be made of a material having lower damping than an anti-ferromagnet containing platinum manganese (PtMn), iridium manganese (IrMn) or the like, and the scattering of spin torque injected into the ferromagnetic layer 31a can be suppressed. As a result, the spin torque can be efficiently injected with a smaller amount of write current, and the magnetization direction of the ferromagnetic layer 31a can be easily reversed. Therefore, the addition of the anti-ferromagnet 31c does not necessitate an increase in the write current. The anti-ferromagnet 31c can be made of a material having a high Neel temperature by selecting the above-mentioned material. Therefore, even when exposed to a high-temperature environment at the time of annealing process, the anti-ferromagnet 31c is not deprived of anti-ferromagnetism and can maintain exchange coupling with the ferromagnetic layer 31a.

Since the anti-ferromagnet 31c has an fct crystal structure, it may prevent the ferromagnetic layer 31a from crystallizing into the bcc structure. In the first embodiment, the stacked structure 31 is provided with a soft magnetic layer 31b of an amorphous structure between the ferromagnetic layer 31a and the anti-ferromagnet 31c. Specifically, the soft magnetic layer 31b contains at least one kind of element selected from cobalt (Co), iron (Fe), nickel (Ni) and manganese (Mn), and at least one kind of element selected from niobium (Nb), zirconium (Zr), tantalum (Ta), titanium (Ti), hafnium (Hf), silicon (Si) and gadolinium (Gd). Owing to this, the soft magnetic layer 31b easily maintains an amorphous state, and the ferromagnetic layer 31a and the anti-ferromagnet 31c are crystallographically divided by the soft magnetic layer 31b. Therefore, the adverse effects which the anti-ferromagnet 31c may have on the crystallization of the ferromagnetic layer 31a to the bcc structure can be reduced.

The soft magnetic layer 31b has magnetism and its film thickness is set to be 0.1 nanometers or more and 0.3 nanometers or less. Owing to this, exchange coupling can be maintained even though the soft magnetic layer 31b is provided between the ferromagnetic layer 31a and the anti-ferromagnet 31c.

2. Second Embodiment

In the first embodiment, reference was made to the case where the soft magnetic layer 31b is provided between the ferromagnetic layer 31a and the anti-ferromagnet 31c, but this is not restrictive. For example, the soft magnetic layer 31b may crystallize from an amorphous state by annealing and lose its soft magnetic property. In the description below, the configurations and manufacturing processes similar to those of the first embodiment will not be mentioned, and mainly the configurations and manufacturing processes different from those of the first embodiment will be mentioned.

2.1 Configuration of Magnetoresistive Effect Element

First, a configuration of a magnetoresistive effect element of a magnetic storage device of a second embodiment will be described.

FIG. 10 is a sectional view to explain the configuration of the magnetoresistive effect element of the magnetic storage device according to the second embodiment. FIG. 10 corresponds to FIG. 4 referred to in connection with the first embodiment, and a hard magnetic layer 31b' is provided in place of the soft magnetic layer 31b shown in FIG. 4.

The hard magnetic layer 31b' is a ferromagnetic layer having a coercive force higher than that of the soft magnetic layer 31b and has a magnetization easy axis direction perpendicular to the film surface. The hard magnetic layer 31b' can have the same magnetization direction as the ferromagnetic layer 31a, for example, by ferromagnetically coupling with the ferromagnetic layer 31a. Like the soft magnetic layer 31b according to the first embodiment, the hard magnetic layer 31b' contains at least one of cobalt (Co), iron (Fe), nickel (Ni), and manganese (Mn). The hard magnetic layer 31b' may contain at least one kind of element selected from cobalt (Co), iron (Fe), nickel (Ni) and manganese (Mn), and at least one kind of element selected from niobium (Nb), zirconium (Zr), tantalum (Ta), titanium (Ti), hafnium (Hf), silicon (Si) and gadolinium (Gd). More specifically, the hard magnetic layer 31b' may contain at least one kind of alloy selected from, for example, cobalt titanium (CoTi), cobalt hafnium (CoHf), cobalt zirconium (CoZr), nickel niobium (NiNb), nickel zirconium (NiZr), nickel tantalum (NiTa), nickel titanium (NiTi), nickel hafnium (NiHf), manganese silicon (MnSi) and manganese gadolinium (MnGd). In addition, the hard magnetic layer 31b' may contain boron (B) as impurities.

2.2 Manufacturing Method

Next, a method of manufacturing a magnetoresistive effect element of the magnetic storage device of the second embodiment will be described.

Figure 11:
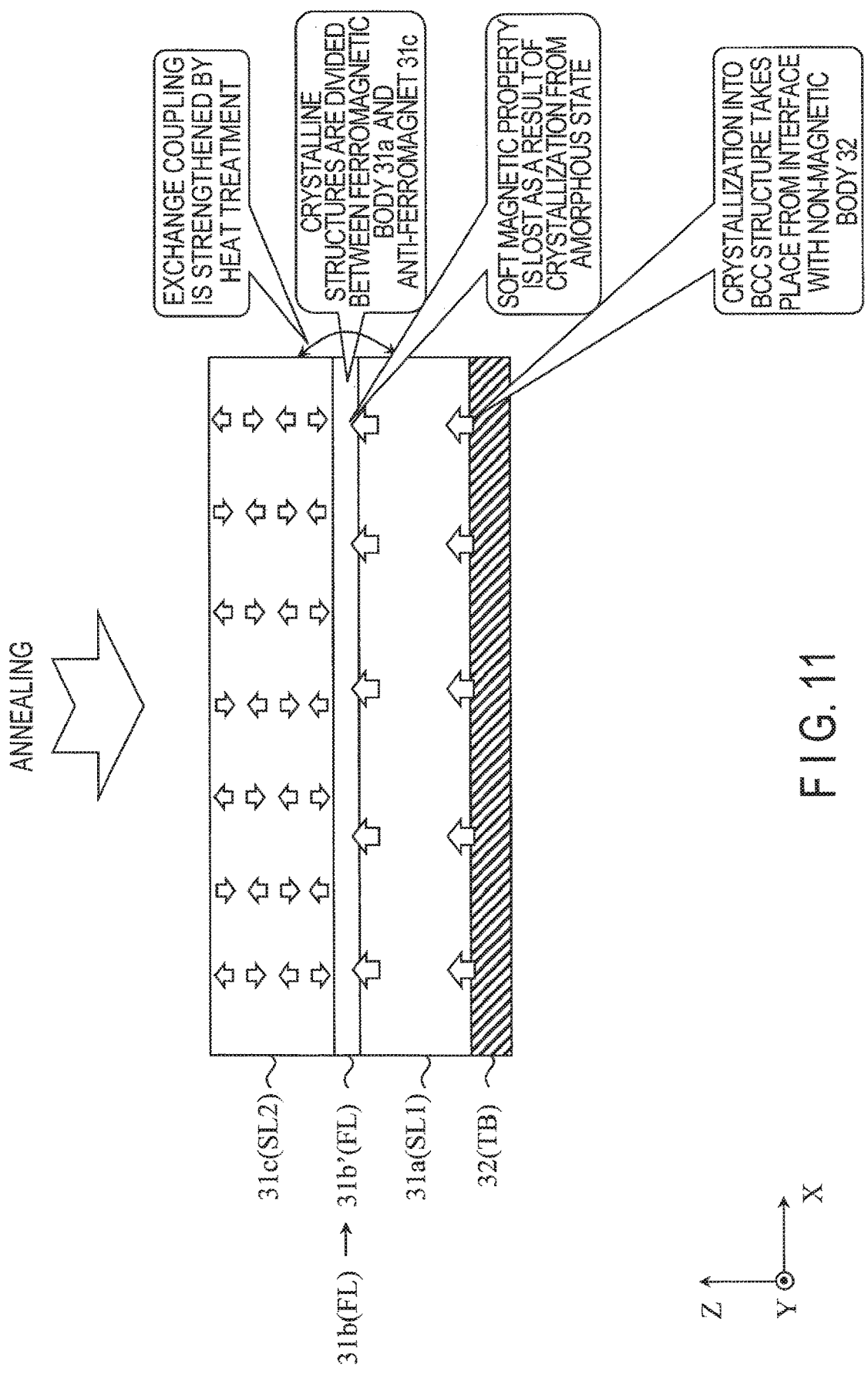
FIG. 11 is a schematic view to explain a method in which the magnetoresistive effect element of the magnetic storage device of the second embodiment is manufactured.
Figure 12:
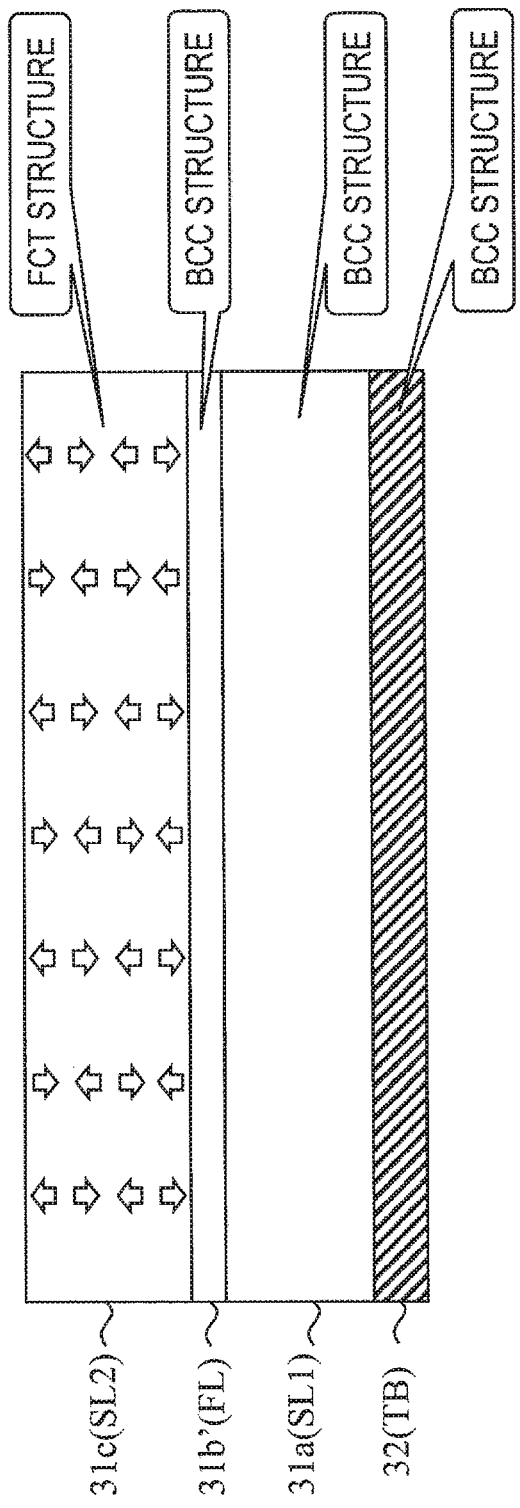
FIG. 12 is a schematic view to explain a method in which the magnetoresistive effect element of the magnetic storage device of the second embodiment is manufactured.

FIGS. 11 and 12 are schematic views to explain the method of manufacturing a magnetoresistive effect element of the magnetic storage device according to the second embodiment. FIGS. 11 and 12 respectively correspond to FIGS. 7 and 8 referred to in connection with the first embodiment.

As in FIG. 6 showing the first embodiment, a non-magnetic layer 32, a ferromagnetic layer 31a, a soft magnetic layer 31b, and an anti-ferromagnet 31c are stacked in this order. Each of the stacked layers is removed, for example, by etching using an ion beam, except for those portions which are to function as the magnetoresistive effect element MTJ.

Next, as shown in FIG. 11, an annealing process shown in FIG. 10 is performed on the stacked layers. The non-magnetic layer 32 can control the orientation of the crystal structure of the ferromagnetic layer 31a. In other words, the ferromagnetic layer 31a can grow (solid phase epitaxy) a crystal structure with the non-magnetic layer 32 as a seed. As a result, the lattice spacing in the crystal plane the ferromagnetic layer 31a equals to the lattice spacing in the crystal plane of the non-magnetic layer 32, and therefore the ferromagnetic layer 31a has a bcc crystal structure. Here, such a relationship between the ferromagnetic layer 31a and the non-magnetic layer 32 is referred to as the "same structure". During the annealing process, the soft magnetic layer 31b in the amorphous state prevents the ferromagnetic layer 31a from crystallizing from the side of the anti-ferromagnet 31c. As a result, the soft magnetic layer 31b can crystallographically divide the ferromagnetic layer 31a of the bcc crystal structure and the anti-ferromagnet 31c of the fct crystal structure from each other.

On the other hand, the soft magnetic layer 31b may crystallize from an amorphous state into a bcc structure simultaneously with the crystallization of the ferromagnetic layer 31a. Along with this, the soft magnetic layer 31b is deprived of its soft magnetic property and becomes a hard magnetic layer 31b'. The hard magnetic layer 31b' maintains exchange coupling between the ferromagnetic layer 31a and the anti-ferromagnet 31c by its own magnetism. The exchange coupling becomes stronger in a higher temperature environment.

Next, as shown in FIG. 12, the annealing process shown in FIG. 11 finishes. Since the crystallization of the ferromagnetic layer 31a is almost completed at a state where the soft magnetic layer 31b becomes the hard magnetic layer 31b', the crystallization of the ferromagnetic layer 31a is little affected by the anti-ferromagnet 31c. Owing to this, the hard magnetic layer 31b' prevents the anti-ferromagnet 31c of the fct crystal structure from having adverse effects on the crystallization of the ferromagnetic layer 31a into the bcc structure. Therefore, the ferromagnetic layer 31a is allowed to have characteristics required for functioning as a storage layer SL, such as interfacial magnetic anisotropy.

Next, a magnetization process is performed for each of the layers that are subjected to the annealing process shown in FIG. 12, in a similar manner to that of FIG. 9 showing the first embodiment.

In this manner, the process of manufacturing the magnetoresistive effect element MTJ is completed.

2.3 Advantages of Present Embodiment

In the second embodiment, the stacked structure 31 includes a hard magnetic layer 31b' provided between the ferromagnetic layer 31a and the anti-ferromagnet 31c. At the time of film formation, the hard magnetic layer 31b' is stacked as a soft magnetic layer 31b in an amorphous state. Therefore, the amorphous state is maintained when the ferromagnetic layer 31a crystallizes from the amorphous state during the annealing process. As in the first embodiment, therefore, the high-quality crystallization of the ferromagnetic layer 31a is not adversely affected by the anti-ferromagnet 31c.

The soft magnetic layer 31b stacked at the time of film formation is deprived of soft magnetic property because it becomes the hard magnetic layer 31b' after crystallization of the ferromagnetic layer 31a, but the hard magnetic layer 31b' still has magnetism and can maintain the exchange coupling between the ferromagnetic layer 31a and the anti-ferromagnet 31c. As in the first embodiment, therefore, the retention characteristics can be improved while suppressing an increase in the write current of the storage layer SL.

3. Modifications

The present invention is not limited to the first and second embodiments described above, and various modifications are applicable. In the descriptions below, several modifications applicable to both of the first and second embodiments will be mentioned. For the sake of convenience of description, how the modifications differ from the first embodiment will mainly be described.

Although the magnetoresistive effect elements MTJ described in connection with the first and second embodiments are a top free type in which a storage layer SL is provided above a reference layer RL, they may be a bottom-free type in which the storage layer is SL is provided below the reference layer RL.

FIG. 13 is a sectional view to explain a configuration of a magnetoresistive effect element of a magnetic storage device according to a first modification. FIG. 13 shows a configuration of a bottom-free type magnetoresistive effect element MTJ, as compared the top-free type magnetoresistive effect element MTJ described with reference to FIG. 4 of the first embodiment.

As shown in FIG. 13, in the case of the bottom-free type, element 22 is formed by stacking a plurality of materials, for example, a stacked structure 31, non-magnetic layer 32, ferromagnetic layer 33, non-magnetic layer 34, and ferromagnetic layer 35, which are stacked in this order in the direction from the word line WLd side toward the bit line BL side (i.e., in the Z direction). Element 25 is formed by stacking a plurality of materials, for example, a stacked structure 31, non-magnetic layer 32, ferromagnetic layer 33, non-magnetic layer 34, and ferromagnetic layer 35, which are stacked in this order in the direction from the bit line BL side toward the word line WLu side (i.e., in the Z direction). The stacked structure 31 is formed such that an anti-ferromagnet 31c, a soft magnetic layer 31b and a ferromagnetic layer 31a are stacked in this order, and a non-magnetic layer 32 is provided on the upper surface of the ferromagnetic layer 31a. Ferromagnetic layer 31a, soft magnetic layer 31b, anti-ferromagnet 31c, non-magnetic layer 32, ferromagnetic layer 33, non-magnetic layer 34, and ferromagnetic layer 35 are formed, for example, of the same materials as mentioned in connection with the first embodiment. With the above configuration, the bottom-free type provides the same advantages as mentioned in the first embodiment.

In the memory cells MC described in connection with the first and second embodiments, the selector SEL was described as a two-terminal switching element, but an MOS (metal oxide semiconductor) may be applied. That is, the memory cell array 10 is not limited to the structure in which the multiple layers are disposed in Z direction described above, and any arbitrary array configuration is applicable.

Figure 14:
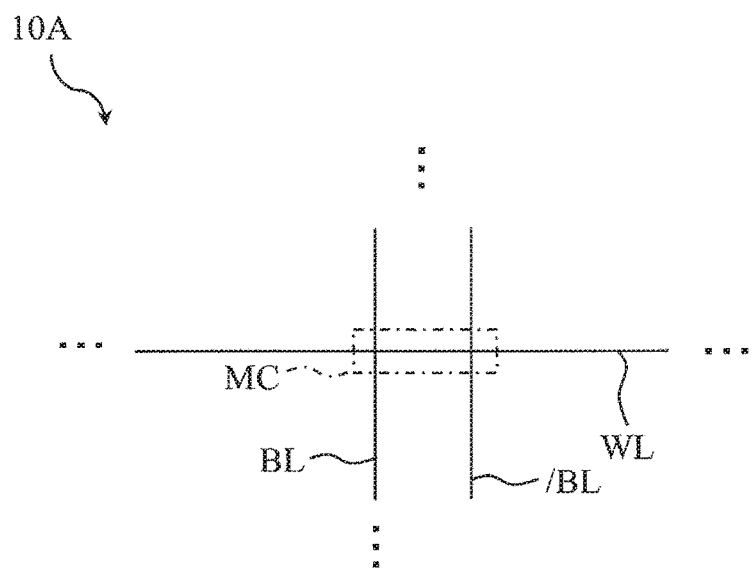
FIG. 14 is a circuit diagram to explain a configuration of a memory cell array of a magnetic storage device according to a second modification.

FIG. 14 is a circuit diagram to explain a configuration of a memory cell array of a magnetic storage device according to a second modification. FIG. 14 corresponds to the memory cell array 10 of the magnetic storage device 1 of the first embodiment described with reference to FIG. 1.

As shown in FIG. 14, the memory cell array 10A includes a plurality of memory cells MC, each of which is associated with a row and a column. The memory cells MC in the same row are connected to the same word line WL, and the memory cells MC in the same column are connected at one end to the same bit line BL and at the other end to the same bit line/BL.

Figure 15:
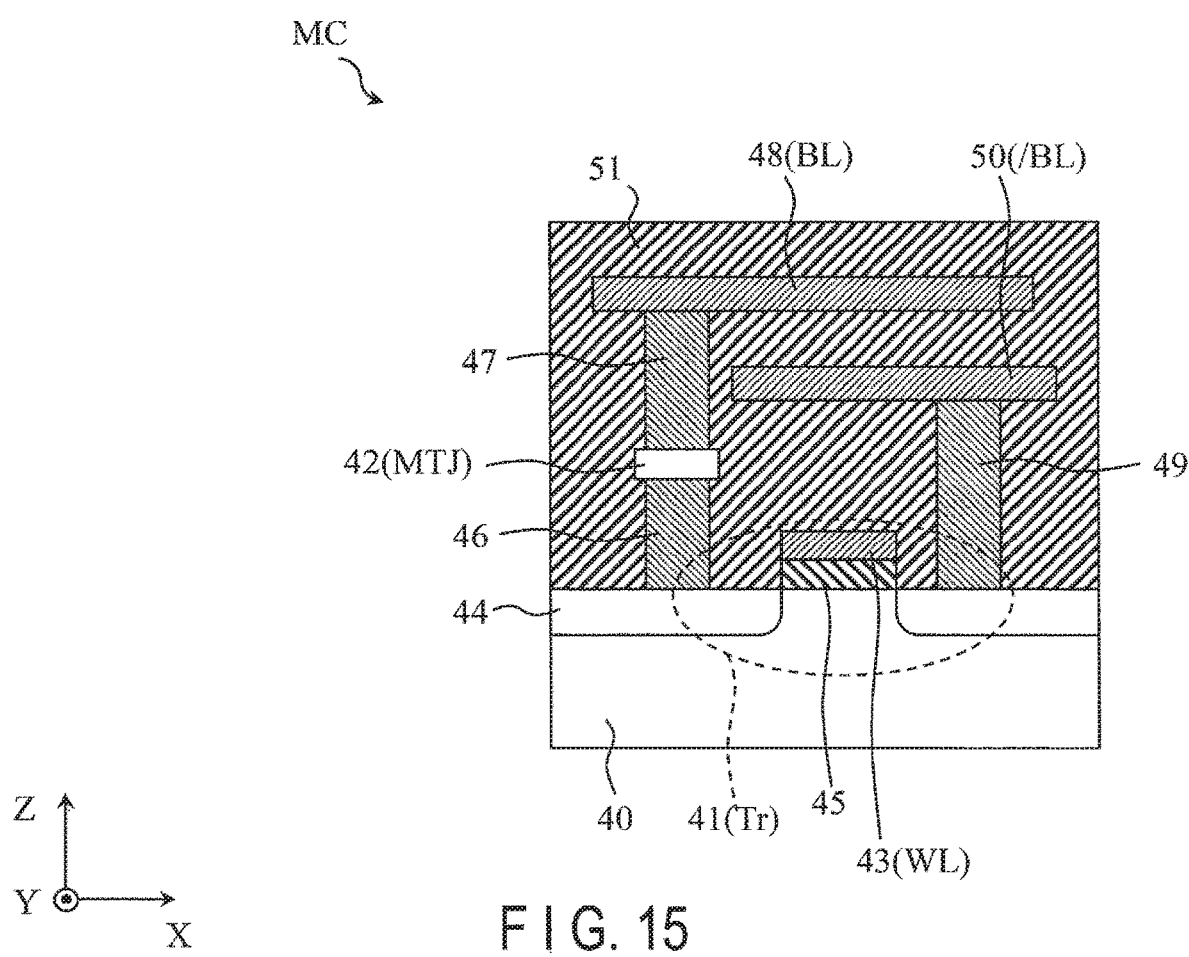
FIG. 15 is a sectional view to explain a configuration of a memory cell of the magnetic storage device of the second modification.

FIG. 15 is a sectional view to explain a configuration of a memory cell of the magnetic storage device of the second modification. What FIG. 15 shows corresponds to the memory cell MC of the first embodiment described with reference to FIG. 3. In the example shown in FIG. 15, a stack of memory cells MC is not provided on the semiconductor substrate, so that suffixes such as "u" and "d" are not added.

As shown in FIG. 15, memory cell MC is provided on the semiconductor substrate 40, and includes a selection transistor 41(Tr) and a magnetoresistive effect element 42(MTJ). The selection transistor 41 is provided as a switch for controlling whether or not current should be supplied when data is written to and read from the magnetoresistive effect element 42. The configuration of the magnetoresistive effect element 42 is similar to that shown in FIG. 3 of the first embodiment or FIG. 13 of the first modification.

The selection transistor 41 includes a gate (conductor 43) functioning as a word line WL, and a pair of source/drain regions (diffusion regions 44) provided on the semiconductor substrate 40 at respective ends of the gate as viewed in the X direction. The conductor 43 is provided on an insulator 45, which is provided on the semiconductor substrate 40 and functions as a gate insulating film. Conductors 43 extend, for example, in the Y direction and are commonly connected to the gates of selection transistors (not shown) of other memory cells MC arranged side by side in the Y direction. Conductors 43 are arranged side by side, for example, in the X direction. Contact 46 is provided on the diffusion region 44 provided at the first end of the selection transistor 41. Contact 46 is connected to the lower surface (first end) of the magnetoresistive effect element 42. Contact 47 is provided on the upper surface (second end) of the magnetoresistive effect element 42, and conductor 48 functioning as a bit line BL is connected to the upper surface of contact 47. Conductors 48 extend, for example, in the X direction and are connected in common to the second ends of magnetoresistive effect elements (not shown) of other memory cells arranged side by side in the X direction. Contact 49 is provided on the diffusion region 44 provided at the second end of the selection transistor 41. Contact 49 is connected to the lower surface of conductor 50 functioning as source line/BL. Conductors 50 extend, for example, in the X direction and are connected in common to the second ends of selection transistors (not shown) of other memory cells arranged side by side, for example, in the Y direction. Conductors 48 and 50 are arranged side by side, for example, in the Y direction. Conductors 48 are positioned above conductors 50, for example. Although not illustrated in FIG. 15, conductors 48 and 50 are arranged such that they are not interfered with each other physically or electrically. The selection transistor 41, the magnetoresistive effect element 42, conductors 43, 48, and 50, and contacts 46, 47, and 49 are covered in an interlayer insulating film 51. Other magnetoresistive effect elements (not shown) arranged in the X or Y direction with respect to the magnetoresistive effect element 42 are provided on the same hierarchy, for example. That is, in the memory cell array 10A, the magnetoresistive effect elements 42 are arranged side by side, for example, in the XY plane.

With the above configuration, the same advantages as the first embodiment are achieved even in a case where a MOS transistor having three terminals (three-terminal type switching element) is applied to the selector SEL in place of the selector SEL having two terminals (two-terminal type switching element) described above.

In connection with the memory cells MC described in connection of the above embodiments and modifications, the case where the magnetoresistive effect element MTJ is provided below the selector SEL was described. Instead of this, the magnetoresistive effect element MTJ may be provided above the selector SEL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
a magnetoresistive effect element including a non-magnet, and a stacked structure on the non-magnet,
the stacked structure including:
a first ferromagnet on the non-magnet;
an anti-ferromagnet being exchange-coupled with the first ferromagnet; and
a second ferromagnet between the first ferromagnet and the anti-ferromagnet,
wherein:
the stacked structure is configured to have a first resistance value in response to a first current flowing through the stacked structure in a first direction, and to have a second resistance value different from the first resistance value in response to a second current flowing through the stacked structure in a second direction opposite to the first direction,
the magnetoresistive effect element further includes a third ferromagnet provided on a side of the non-magnet which is opposite to a side of the non-magnet on which the first ferromagnet is provided,
the first ferromagnet, the non-magnet, and the third ferromagnet are part of a magnetic tunnel junction,
a magnetization direction of the third ferromagnet is fixed and does not change in response to the first current and the second current, and
the second ferromagnet has a same crystal structure as the first ferromagnet.

2. The device of claim 1, wherein the second ferromagnet has a film thickness of 0.1 nanometers or more and 0.3 nanometers or less.

3. The device of claim 1, wherein the second ferromagnet includes at least one element selected from cobalt (Co), iron (Fe), nickel (Ni), and manganese (Mn).

4. The device of claim 3, wherein the second ferromagnet further includes at least one element selected from niobium (Nb), zirconium (Zr), tantalum (Ta), titanium (Ti), hafnium (Hf), silicon (Si) and gadolinium (Gd).

5. The device of claim 4, wherein the second ferromagnet contains at least one alloy selected from cobalt titanium (CoTi), cobalt hafnium (CoHf), cobalt zirconium (CoZr), nickel niobium (NiNb), nickel zirconium (NiZr), nickel tantalum (NiTa), nickel titanium (NiTi), nickel hafnium (NiHf), manganese silicon (MnSi) and manganese gadolinium (MnGd).

6. The device of claim 1, wherein the anti-ferromagnet includes nickel manganese (NiMn) or palladium manganese (PdMn).

7. The device of claim 1, wherein the anti-ferromagnet has a crystal structure different from a crystal structure of the first ferromagnet.

8. The device of claim 7, wherein the crystal structure of the first ferromagnet is the same as a crystal structure of the non-magnet.

9. The device of claim 1, further comprising:
a memory cell including the magnetoresistive effect element, and a switching element connected to the magnetoresistive effect element.

10. A magnetic storage device comprising:
a magnetoresistive effect element including a non-magnet, and a stacked structure on the non-magnet,
the stacked structure including:
a first ferromagnet on the non-magnet;
an anti-ferromagnet being exchange-coupled with the first ferromagnet; and
a second ferromagnet between the first ferromagnet and the anti-ferromagnet,
wherein:
the stacked structure is configured to have a first resistance value in response to a first current flowing through the stacked structure in a first direction, and to have a second resistance value different from the first resistance value in response to a second current flowing through the stacked structure in a second direction opposite to the first direction,
the magnetoresistive effect element further includes a third ferromagnet provided on a side of the non-magnet which is opposite to a side of the non-magnet on which the first ferromagnet is provided,
the first ferromagnet, the non-magnet, and the third ferromagnet are part of a magnetic tunnel junction,
a magnetization direction of the third ferromagnet is fixed and does not change in response to the first current and the second current, and
the anti-ferromagnet has a crystal structure different from a crystal structure of the first ferromagnet.

11. The device of claim 10, wherein the second ferromagnet has a film thickness of 0.1 nanometers or more and 0.3 nanometers or less.

12. The device of claim 10, wherein the second ferromagnet has an amorphous structure.

13. The device of claim 10, wherein the second ferromagnet has a same crystal structure as the first ferromagnet.

14. The device of claim 10, wherein the second ferromagnet includes at least one element selected from cobalt (Co), iron (Fe), nickel (Ni), and manganese (Mn).

15. The device of claim 14, wherein the second ferromagnet further includes at least one element selected from niobium (Nb), zirconium (Zr), tantalum (Ta), titanium (Ti), hafnium (Hf), silicon (Si) and gadolinium (Gd).

16. The device of claim 15, wherein the second ferromagnet contains at least one alloy selected from cobalt titanium (CoTi), cobalt hafnium (CoHf), cobalt zirconium (CoZr), nickel niobium (NiNb), nickel zirconium (NiZr), nickel tantalum (NiTa), nickel titanium (NiTi), nickel hafnium (NiHf), manganese silicon (MnSi) and manganese gadolinium (MnGd).

17. The device of claim 14, wherein the second ferromagnet further includes boron (B).

18. The device of claim 10, wherein the anti-ferromagnet includes nickel manganese (NiMn) or palladium manganese (PdMn).

19. The device of claim 10, wherein the crystal structure of the first ferromagnet is the same as a crystal structure of the non-magnet.

20. The device of claim 10, further comprising:
a memory cell including the magnetoresistive effect element, and a switching element connected to the magnetoresistive effect element.

* * * * *